(12) United States Patent
Herbert et al.

(10) Patent No.: US 7,177,219 B1
(45) Date of Patent: Feb. 13, 2007

(54) DISABLING CLOCKED STANDBY MODE BASED ON DEVICE TEMPERATURE

(75) Inventors: David Herbert, Raleigh, NC (US); Ben Heilmann, Raleigh, NC (US); George Alexander, Durham, NC (US); Torsten Partsch, Raleigh, NC (US)

(73) Assignee: Infineon Technologies AG, Munich (DE)

( * ) Notice: Subject to any disclaimer, the term of this patent is extended or adjusted under 35 U.S.C. 154(b) by 11 days.

(21) Appl. No.: 11/187,643

(22) Filed: Jul. 22, 2005

(51) Int. Cl.
*G11C 7/04* (2006.01)
*G11C 8/00* (2006.01)

(52) U.S. Cl. .................................... 365/211; 365/233

(58) Field of Classification Search ................ 365/211, 365/233; 327/538, 540
See application file for complete search history.

(56) References Cited

U.S. PATENT DOCUMENTS 6,492,863 B2 * 12/2002 Kono et al. .................. 327/538
6,677,804 B2 * 1/2004 Pekny ......................... 327/535

* cited by examiner

*Primary Examiner*—Son T. Dinh
(74) *Attorney, Agent, or Firm*—Patterson & Sheridan, L.L.P.

(57) ABSTRACT

A method and apparatus for controlling a voltage generator of a memory device are provided. A temperature of the memory device is measured. If the measured temperature is outside a threshold temperature range, the memory device is allowed to be placed in a clocked standby mode (CSM), whereby the voltage generator is selectively enabled with a clock signal. If the measured temperature is within a threshold temperature range, the memory device is prevented from being placed in the clocked standby mode (CSM).

20 Claims, 8 Drawing Sheets

DISABLING CLOCKED STANDBY MODE BASED ON DEVICE TEMPERATURE

CROSS-REFERENCE TO RELATED APPLICATIONS

This application is related to U.S. patent application Ser. No. 11/187,546, entitled CLOCKED STANDBY MODE WITH MAXIMUM CLOCK FREQUENCY, filed Jul. 22, 2005, by Herbert et al. This related patent application is herein incorporated by reference in its entirety.

BACKGROUND OF THE INVENTION

1. Field of the Invention

Embodiments of the present invention generally relate to an improved implementation of clocked standby mode in a digital circuit.

2. Description of the Related Art

Integrated circuit (IC) devices often operate using various internally generated voltages in an effort to reduce sensitivity to fluctuating external voltage supplies. Each internally generated voltage may also be used to perform different functions required by the IC. A voltage generation circuit may be used to generate each necessary internal voltage. A typical memory device, such as a dynamic random access memory (DRAM) device may include many such voltage generation circuits, configured to generate a wide variety of voltages, which may include voltages that are positive with respect to a ground reference (e.g., a boosted wordline voltage or $V_{PP}$) and voltages that are negative with respect to a ground reference (e.g., a back-bias voltage, $V_{BB}$, or negative wordline voltage, $V_{NWL}$)

Each voltage generation circuit on a given device may consume power while generating a voltage. In order to conserve the overall power consumed by the IC device, the voltage generation circuit may be placed in a mode (referred to as a standby mode) where the circuit is selectively enabled and disabled. The voltage generation circuit may be enabled while the required voltage is being used by the IC device (e.g., to maintain the generated voltage). For instance, if the IC device is a memory device, the voltage generation circuit may be enabled while the memory device is using the output of the voltage generation circuit to perform an access (e.g., a read or write). While the voltage generation circuit is enabled, the voltage generation circuit may consume power and maintain the required voltage. When the memory device is not being accessed, the voltage generation circuit may be disabled. While the voltage generation circuit is disabled, the circuit may consume less power and the required voltage may not be generated. Because each access to the memory device may be timed according to a clock signal (e.g., each access to the memory device may occur on the rising edge of the clock signal), the clock signal may be used to selectively enable and disable the voltage generation circuit just prior to the access. Accordingly, the standby mode may be referred to as a clocked standby mode (CSM).

FIG. 1 is a block diagram depicting an exemplary memory device 100 which utilizes a clocked standby mode. The memory device 100 may have control circuits 102 used to access one or more memory arrays 104 of the memory device 100. The control circuits 102 may have several internal circuits which may be used to configure and control the memory device. For instance, the control circuits 102 may have clock circuitry 106 for generating various clock signals and a temperature sensor 108 which may be used to measure the temperature of the memory device 100.

The memory device 100 may contain voltage generation circuit(s) 112 which supply internally generated voltage(s) ($V_{OUT}$(s), $V_1$, $V_2$, ... $V_X$) to the control circuits 102 and memory arrays 104 of the memory device 100. Each internally generated voltage $V_1$, $V_2$, ... $V_X$ may be generated as a function of a reference voltage. The reference voltage may be generated by a reference voltage generator and may be used by the control circuits 102 to access (e.g., read, write or refresh) memory arrays 104. The voltage generation circuit(s) 112 may be selectively enabled and disabled by clocked standby mode controls 114. In some cases, the clocked standby mode controls 114 may be enabled or disabled by the control circuits 102. In other cases, the clocked standby mode controls 114 may be permanently enabled such that an enabling signal is not used, or may be permanently enabled by blowing a fuse such as a laser fuse or electronically programmable fuse (e-fuse) of the memory device 100.

FIG. 2 is a block diagram depicting exemplary clocked standby mode controls 114 which are used to selectively enable one or more voltage generation circuits 112. The inputs to the clocked standby mode controls may be a base clock signal (referred to as Base_CLK) and a signal to enable the clocked standby mode (referred to as CSM_EN). When CSM_EN is a high logic value, the clocked standby mode may be enabled, and the clocked standby mode circuits may use the base clock signal to generate a clocked standby mode clock signal (referred to as CSM_CLK) which selectively enables and disables the voltage generation circuits 112. When CSM_EN is a certain value (e.g., a low logic value), the clocked standby mode may be disabled, meaning that the voltage generation circuits 112 may constantly generate voltage. When the clocked standby mode is disabled, the CSM_CLK signal may be set to a constant value (e.g., a low logic value) in order to constantly enable the voltage generation circuits 112.

FIG. 3 is a circuit diagram depicting an exemplary voltage generation circuit 112. The voltage generation circuit may have circuitry 310 for generating a reference voltage (referred to as $V_{REF}$) which may then be used by a voltage regulator 320 to generate an output voltage (referred to as $V_{OUT}$). When the voltage generator is enabled (e.g., when the CSM_CLK signal is a low logic value), switches S1 302, S2 308, and S3 318 may be closed while switch S4 312 may be open, allowing current to flow through the voltage generation circuit 112 and generating output voltage $V_{OUT}$ from reference voltage $V_{REF}$ as described below.

If CSM_CLK changes from a low logic value to a high logic value, the voltage generator 112 may be disabled. When the voltage generator is disabled, switches S1 302, S2 308, and S3 318 may be open while switch S4 312 may be closed. When switches S1 302, S2 308, and S3 318 are open, the voltage generation circuit 112 may consume less power. When the voltage generation circuit 112 is disabled, $V_{OUT}$ may be electronically isolated from other voltages in the memory device 100 by switches S3 318 and S4 312. When an output voltage is isolated from other voltages in a circuit, the output voltage is referred to as a floating output voltage. While the voltage generation circuit is disabled, capacitance on the output line may maintain the output voltage near a given level (e.g., $V_{OUT}$ at the time the voltage generation circuit is disabled) until the voltage generation circuit 112 is enabled again by CSM_CLK switching from the high logic value to a low logic value.

FIG. 4 is a timing diagram which depicts the effect of the clocked standby mode on the output voltage $V_{OUT}$ of a voltage generation circuit 112. At time T1, the CSM_EN signal may be a low logic value, indicating that the clocked standby mode is disabled. Accordingly, the signal CSM_CLK generated by the clocked standby mode controls 114 may be set at a low logic level, enabling the voltage generation circuit 112 and maintaining $V_{OUT}$ at a constant level. While the voltage generation circuit 112 is enabled, the base clock signal Base_CLK may have no effect on the CSM_CLK signal.

At some time later, T2, the CSM_EN signal may be raised to a high logic level, enabling the clocked standby mode. When the CSM_EN signal is raised, the clocked standby mode controls 114 may assert the CSM_CLK signal to a high logic value, causing the voltage generation circuit 112 to be disabled, thereby floating $V_{OUT}$. While the CSM_EN signal is raised, the clocked standby mode controls 114 may generate CSM_CLK using the Base_CLK signal. Thus, at some time later, T3, when a rising edge of Base_CLK is detected, the CSM_CLK signal may be lowered to a low logic level, causing the voltage generation circuit 112 to be enabled again and causing $V_{OUT}$ to be actively generated by the voltage generation circuit 112.

As described above, the rising edge of Base_CLK may be used to enable the voltage generation circuit 112 because the rising edge of Base_CLK may correspond to accesses (e.g., a read or write) to the memory device 100. During each access, the voltage $V_{OUT}$ generated by the voltage generation circuit 112 may be used by the control circuits 102 to access the memory arrays 104. During the period when $V_{OUT}$ is being used, the voltage generation circuits actively generate and regulate $V_{OUT}$ so that the load on $V_{OUT}$ from the memory device 100 does not cause $V_{OUT}$ to fall below a critical level.

After each rising edge of Base_CLK, the CSM_CLK signal may be lowered for a set time, referred to as the pulse width time, $T_{PW}$. After the time $T_{PW}$ has expired, the CSM_CLK signal may again be asserted, causing the voltage generation circuit 112 to be disabled again. The process of asserting and lowering CSM_CLK may be continued for each rising edge of the Base_CLK as long as the CSM_EN signal is asserted. Thus, the period of the Base_CLK ($T_{BASE}$) as well as the pulse width $T_{PW}$ of CSM_CLK determine when the voltage generation circuit 112 is disabled and for how long.

While the voltage generation circuit 112 is disabled and $V_{OUT}$ is floating, $V_{OUT}$ may not remain at the exact value which is originally floated by the disabled voltage generation circuit 112. Each time the voltage generation circuit 112 is disabled, secondary effects, such as leakage currents, may slowly degenerate $V_{OUT}$, even if $V_{OUT}$ is electrically isolated using switches S1 302, S2 308, S3 318, and S4 312. This degeneration in $V_{OUT}$ is indicated in FIG. 4 as $V_{DROOP}$. The degeneration begins each time the voltage generation circuit 112 is disabled and lasts until the voltage generation circuit 112 is enabled by the rising edge of Base_CLK and the corresponding lowering of the CSM_CLK signal. Each time the voltage generation circuit 112 is enabled, it may take a finite amount of time for the voltage generation circuit 112 to correct $V_{OUT}$ by driving it back to the $V_{REF}$ level. The larger the magnitude of $V_{DROOP}$ is, the longer it may take for the voltage generation circuit 112 to restore $V_{OUT}$. Because $T_{BASE}$ and $T_{PW}$ may be used to control how long the voltage generation circuit 112 is disabled, $T_{BASE}$ and $T_{PW}$ also affect the magnitude of $V_{DROOP}$ and the corresponding time required for the voltage generation circuit 112 to drive $V_{OUT}$ back to an appropriate level.

Because $V_{OUT}$ is used by other circuits in the memory device 100, it may be important that $V_{OUT}$ not fall below a critical level. If $V_{OUT}$ droops too low, the other circuits which use $V_{OUT}$ may not function properly. For instance, if $V_{OUT}$ is used to refresh the memory arrays 104 and $V_{OUT}$ falls below a critical level, the memory arrays 104 may not be properly refreshed and data in the memory arrays 104 may be lost. Thus, $T_{BASE}$ and $T_{PW}$ may be designed so the magnitude of $V_{DROOP}$ does not become too large and so the voltage generation circuit 112 is enabled long enough to drive $V_{OUT}$ back to the appropriate level needed to operate the memory device 100. Similarly, $T_{BASE}$ and $T_{PW}$ may be chosen so that the time for which the voltage generation circuit 112 is disabled (calculated as $T_{BASE}-T_{PW}$) is short enough so that $V_{OUT}$ does not drop below an unacceptable level.

In some cases, as the device operates, variations in the operating characteristics of the device may cause larger voltage droops in $V_{OUT}$. For instance, the period $T_{BASE}$ of the Base_CLK signal may vary with the temperature of the memory device 100. If the temperature of the memory device 100 causes $T_{BASE}$ to increase, the voltage generation circuit 112 may be disabled for a longer period and the magnitude $V_{DROOP}$ may become larger. In another instance, the size of the leakage currents which affect $V_{DROOP}$ may vary with the temperature of the memory device. For example, for some temperature ranges, the leakage currents may increase, causing a corresponding increase in the magnitude of $V_{DROOP}$. Thus, the variations in the operating characteristics of the memory device 100 may cause $V_{OUT}$ to droop so far that the voltage generation circuit 112 cannot drive $V_{OUT}$ back to the appropriate level needed to operate the memory device 100, causing the memory device 100 to malfunction.

Accordingly, what is needed are improved methods and apparatuses for enabling and disabling a voltage generation circuit.

SUMMARY OF THE INVENTION

The present invention provides a method and apparatus for controlling a voltage generator of a memory device. In one embodiment of the invention, a method and apparatus for controlling a voltage generator for a memory device are provided. A temperature of the memory device is measured. If the measured temperature is outside a threshold temperature range, the memory device is allowed to be placed in a clocked standby mode (CSM), whereby the voltage generator is selectively enabled with a clock signal. If the measured temperature is within a threshold temperature range, the memory device is prevented from being placed in the clocked standby mode (CSM). In one embodiment, the temperature range is chosen such that the temperature range includes temperatures at which the clock frequency is above a critical frequency.

In another embodiment of the invention, a clocked standby mode (CSM) is disabled, whereby the voltage generator is selectively enabled in conjunction with a clock signal, if a measured temperature of the memory device is within a threshold temperature range. In one embodiment, disabling the clocked standby mode comprises setting the clock signal to a low logic level while the measured temperature of the memory device is within the threshold temperature range. In yet another embodiment, a period of the clock signal is chosen such that the voltage output by the generator does not fall below a threshold voltage within the period. In another embodiment, the threshold temperature range is chosen such that the temperature range includes temperatures at which a clock frequency of the clock signal is above a critical frequency.

Another embodiment of the invention provides a memory device. In one embodiment, the memory device has a means for generating a voltage and a means for selectively enabling the means for generating. The means for selectively enabling measures a temperature of the memory device. If the measured temperature is outside a threshold temperature range, the memory device is placed in a clocked standby mode (CSM), whereby the means for generating is selectively enabled with a clock signal. If the measured temperature is within a threshold temperature range, the memory device is prevented from being placed in the clocked standby mode (CSM). In one embodiment, the temperature range is chosen such that the temperature range includes temperatures at which the clock frequency is above a critical frequency.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention provides a method and apparatus for controlling a voltage generator of a memory device. In one embodiment of the invention, a method and apparatus for controlling a voltage generator for a memory device are provided. A temperature of the memory device is measured. If the measured temperature is outside a threshold temperature range, the memory device is allowed to be placed in a clocked standby mode (CSM), whereby the voltage generator is selectively enabled with a clock signal. If the measured temperature is within a threshold temperature range, the memory device is prevented from being placed in the clocked standby mode (CSM).

The circuits described herein may be used to advantage in any number of devices that utilize internally generated voltages. However, to facilitate understanding, the following description will refer to memory devices, such as dynamic random access memory (DRAM) devices, as specific, but not limiting examples of devices in which the circuits described herein may be utilized. Further, while the following description may refer certain control signals as being asserted to high logic signals or lowered to low logic signals, those skilled in the art will recognize that such signal levels are merely exemplary and that any circuitry described herein may be configured to use any number of signals of any polarity. Also, while some signals are referred to as originating from a given control circuit or device, it should be recognized that any described control signal may originate from any given circuit or device. Similarly, described implementations of certain circuits such as clocked standby mode controls, control circuits, voltage generators, reference voltage generators, voltage regulators, and so on are merely exemplary. Those skilled in the art will recognize that embodiments of the present invention may be adapted for use with any implementation or configuration of such circuits.

Clocked Standby Mode with Maximum Clock Period

Figure 1:
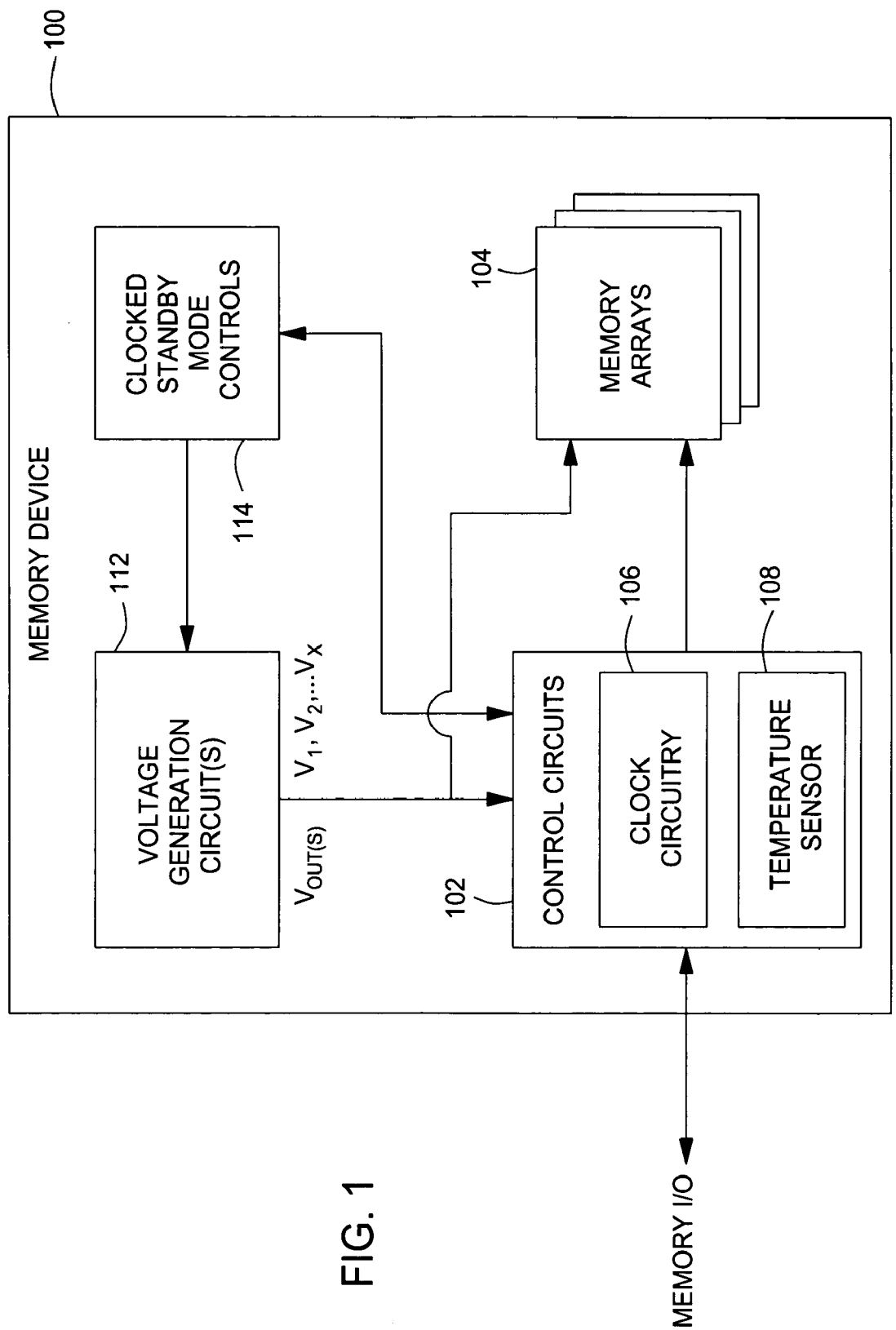
FIG. 1 is a block diagram depicting an exemplary memory device which utilizes a clocked standby mode.
Figure 2:
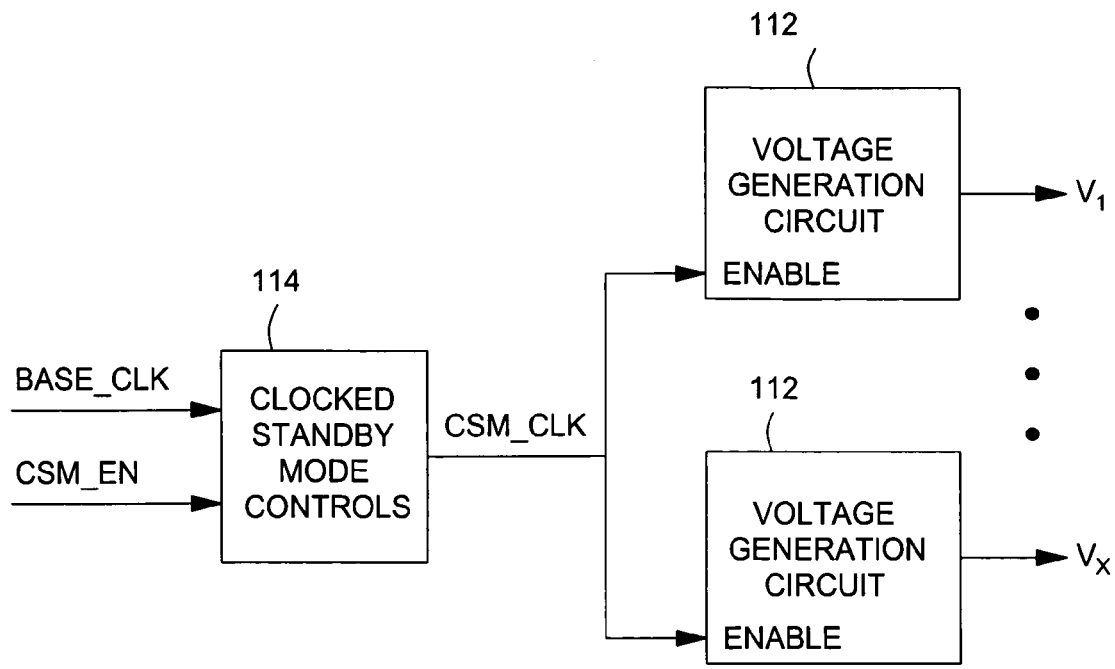
FIG. 2 is a block diagram depicting exemplary clocked standby mode controls which are used to selectively enable one or more voltage generation circuits.

Referring to FIG. 1, if the period $T_{BASE}$ of a base clock signal Base_CLK becomes too large due to variations in the operating characteristics of the memory device 100, the clocked standby mode control signal CSM_CLK used to selectively enable and disable the voltage generation circuit 112 (and generated using Base_CLK) may disable the voltage generation circuit 112 so long that $V_{OUT}$ may droop to an unacceptable level such that the voltage generation circuit 112 may not be able to drive $V_{OUT}$ back to an acceptable level when the voltage generation circuit 112 is enabled. When $V_{OUT}$ is not maintained at an acceptable level, the memory device 100 may malfunction. According to one embodiment of the invention, the droop in $V_{OUT}$ may be limited to an acceptable threshold level by modifying the clocked standby mode controls to use two clock signals to generate the CSM_CLK signal.

Figure 5:
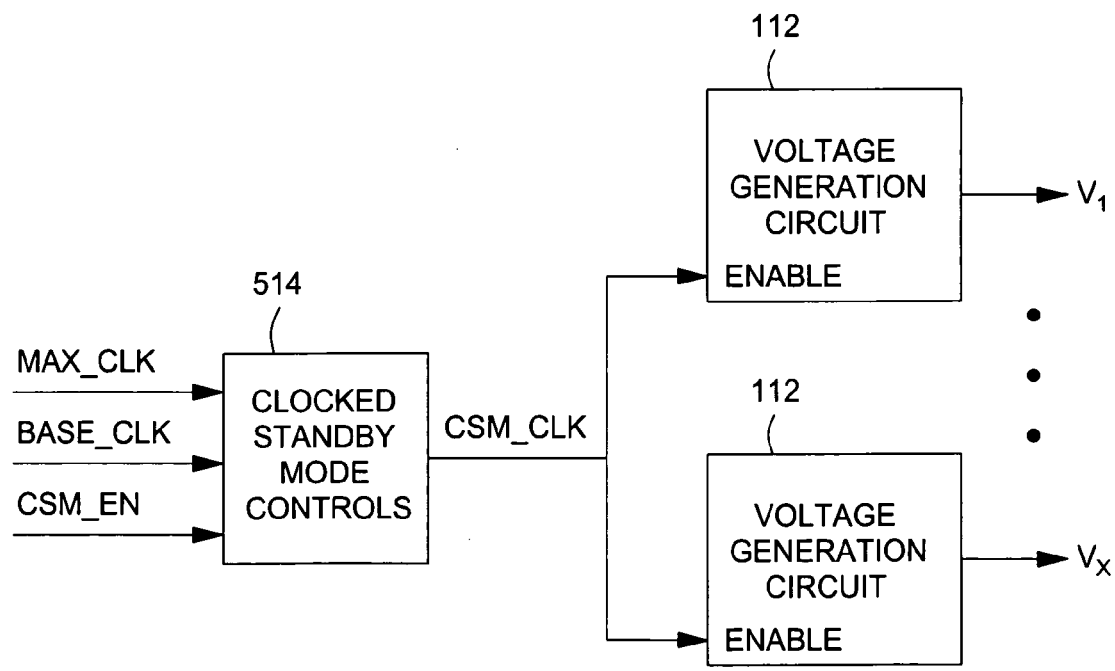
FIG. 5 is a block diagram depicting clocked standby mode controls 114 configured to generate a clocked standby mode clock signal using two clock signals according to one embodiment of the invention.
Figure 3:
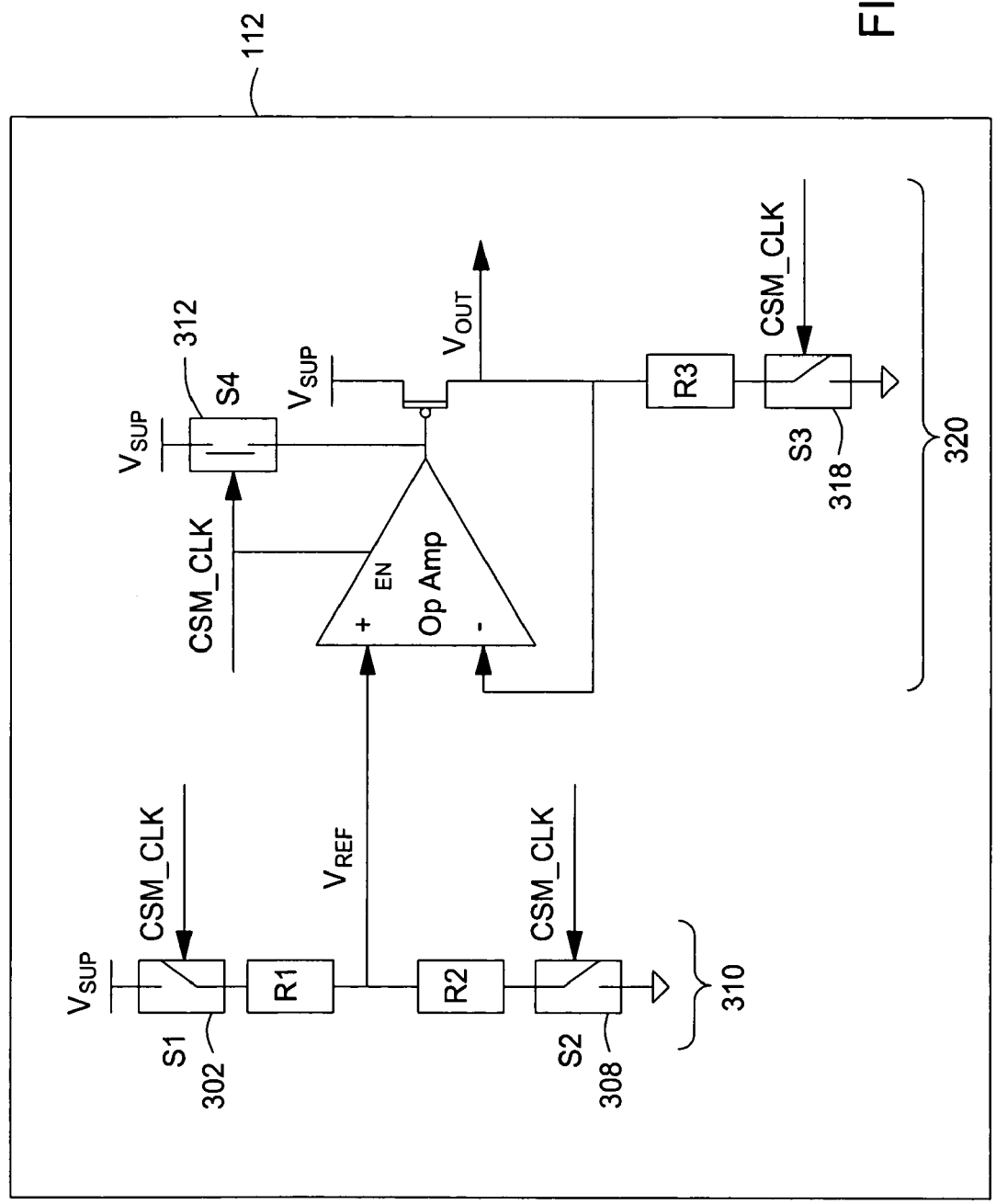
FIG. 3 is a circuit diagram depicting an exemplary voltage generation circuit.
Figure 4:
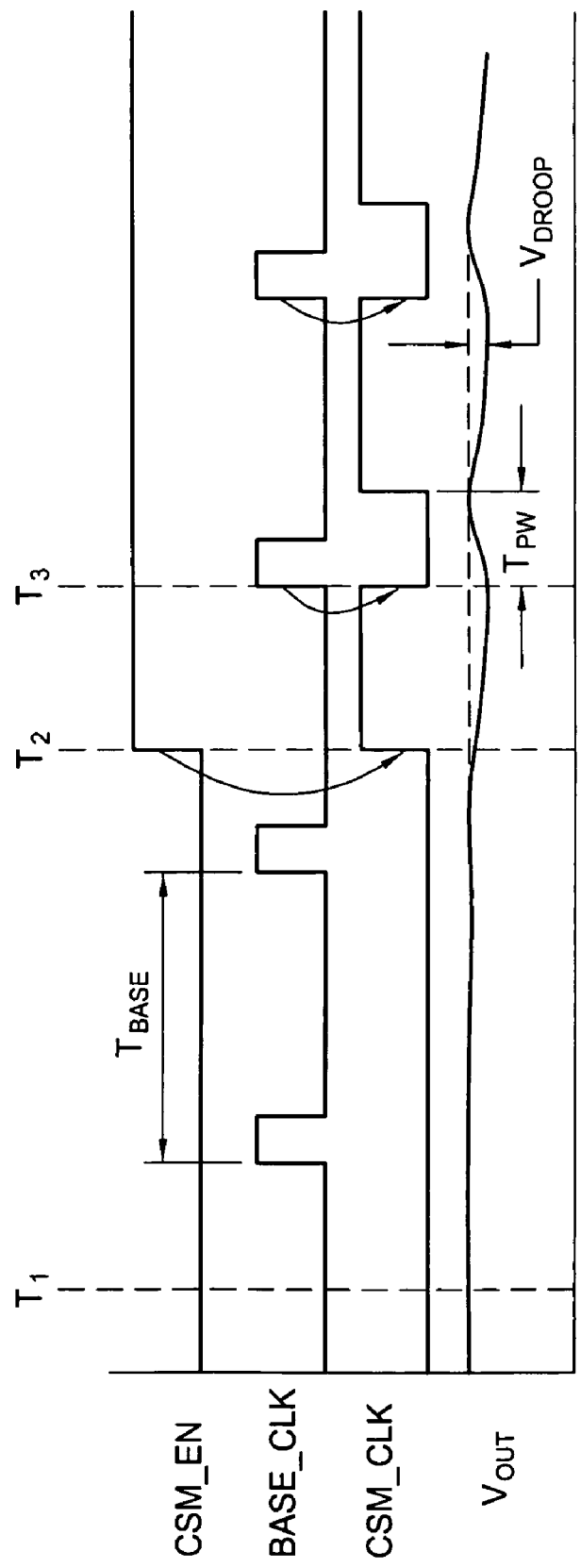
FIG. 4 is a timing diagram which depicts the effect of the clocked standby mode on the output voltage $V_{OUT}$ of a voltage generation circuit.

FIG. 5 is a block diagram depicting clocked standby mode controls 514 configured to generate a clocked standby mode clock signal using two clock signals according to one embodiment of the invention. The inputs to the clocked standby mode controls 514 may include the signal to enable the clocked standby mode (CSM_EN), the base clock signal (Base_CLK), and a clock signal (referred to as Max_CLK) which provides a maximum limit on the amount of time for which the voltage generation circuit 112 may be disabled. The period of Max_CLK may be referred to as $T_{MAX}$. Where $T_{BASE}$ is less than $T_{MAX}$, Base_CLK may be used to generate CSM_CLK. Where $T_{BASE}$ is greater than $T_{MAX}$, Max_CLK may be used to generate CSM_CLK.

By placing an upper limit on the amount of time for which the voltage generation circuit 112 is disabled ($T_{MAX}$–$T_{PW}$), an upper limit may be placed on the magnitude of $V_{DROOP}$, ensuring that $V_{OUT}$ does not fall below an unacceptable level and ensuring that the voltage generation circuit 112 is capable of driving $V_{OUT}$ to the needed level when enabled. Thus, the upper limit on the magnitude of $V_{DROOP}$ imposed by the period $T_{MAX}$ of Max_CLK may ensure that $V_{OUT}$ remains at an acceptable level regardless of the fluctuations in the period $T_{BASE}$ of Base_CLK and the magnitude of $V_{DROOP}$ which result from the changing operating conditions of the memory device 100.

As described above, where the period $T_{BASE}$ of Base_CLK becomes too large to maintain $V_{OUT}$ at an acceptable level, the clocked standby controls 514 may generate the CSM_CLK pulses using the rising edge of Max_CLK.

Figure 6:
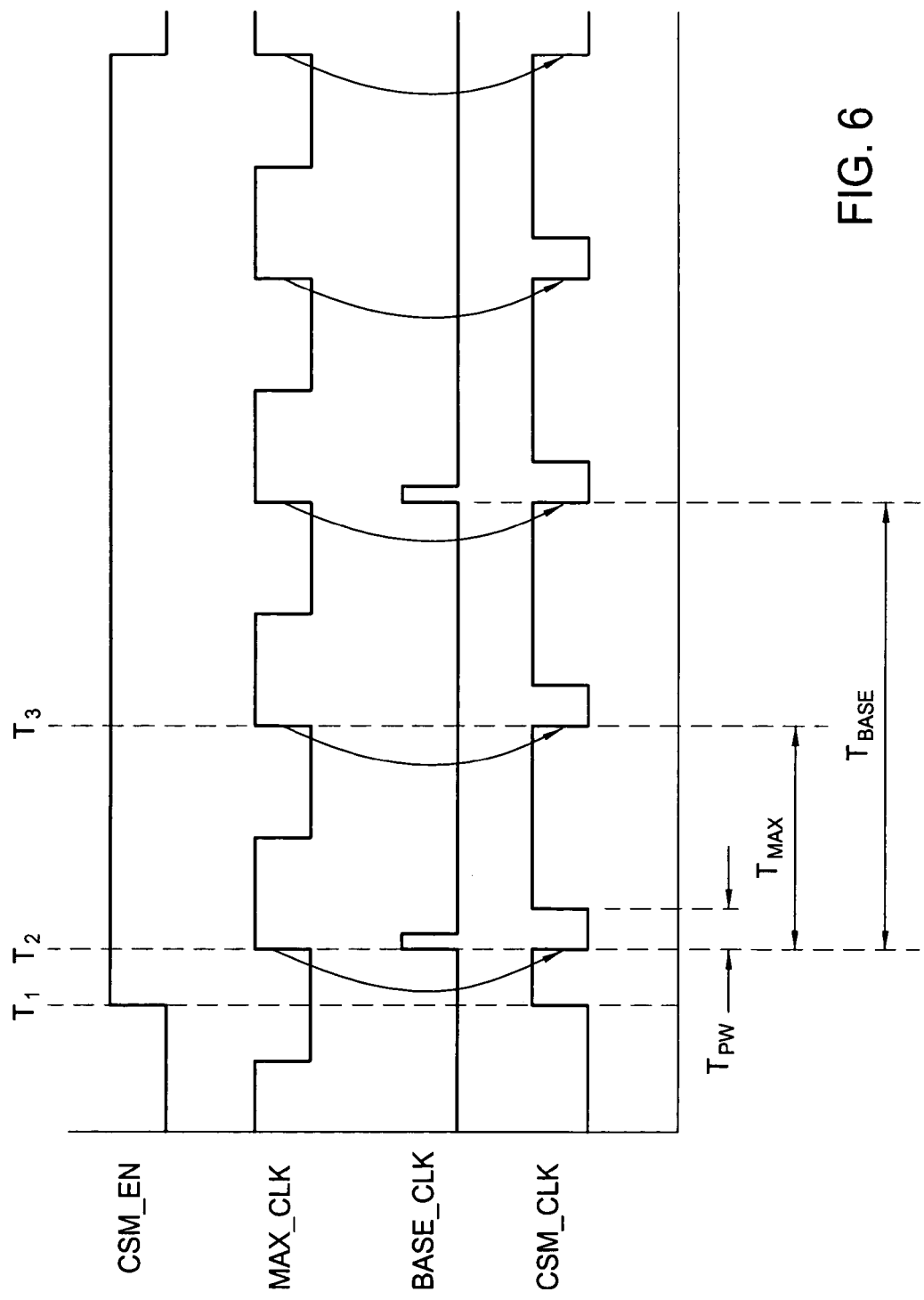
FIG. 6 is a timing diagram which depicts a clocked standby mode control signal which is generated by a clock signal with a maximum period according to one embodiment of the invention.

FIG. 6 is a timing diagram which depicts a clocked standby mode control signal which is generated by a clock signal Max_CLK with a maximum period $T_{MAX}$ according to one embodiment of the invention. At time T1, CSM_EN is asserted to a high logic level. When CSM_EN is asserted, the clocked standby mode is enabled and CSM_CLK may be driven to a high logic level, disabling the voltage generation circuit 112. When the clocked standby mode is enabled, the clocked standby mode controls 514 may determine that the maximum period $T_{MAX}$ of the Max_CLK signal is less than the period $T_{BASE}$ of the Base_CLK signal. Accordingly, at time T2, and again at time T3, the rising edge of $T_{MAX}$ may cause CSM_CLK to be lowered to a low logic level for a time equal to $T_{PW}$. Thus, the time between pulses from CSM_CLK is limited by $T_{MAX}$, and the magnitude of $V_{DROOP}$ is correspondingly limited to an acceptable threshold.

Figure 7:
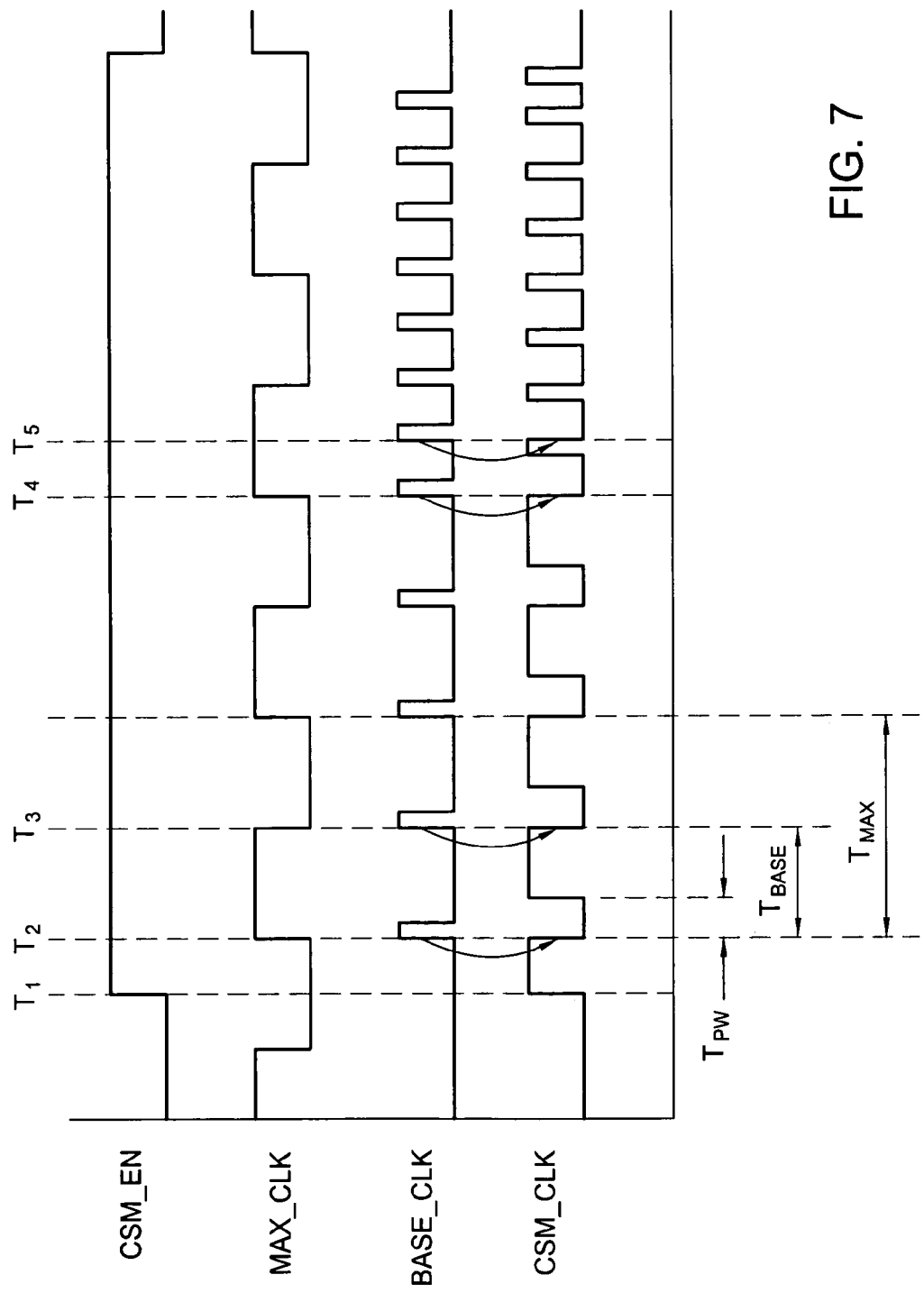
FIG. 7 is a timing diagram which depicts a clocked standby mode control signal which is generated by a clock signal with a period less than the maximum period of another clock signal according to one embodiment of the invention.

FIG. 7 is a timing diagram which depicts a clocked standby mode control signal which is generated by a clock signal Base_CLK with a period less than the maximum period $T_{MAX}$ of Max_CLK according to one embodiment of the invention. At time T1, CSM_EN is asserted to a high logic level. When CSM_EN is asserted, the clocked standby mode is enabled and CSM_CLK may be driven to a high logic level, disabling the voltage generation circuit 112.

When the clocked standby mode is enabled, the clocked standby mode controls 514 may determine that the maximum period $T_{MAX}$ of the Max_CLK signal is greater than the period $T_{BASE}$ of the Base_CLK signal. Where $T_{MAX}$ is greater than $T_{BASE}$, accesses to the memory device (which may occur on the rising edge of Base_CLK) may occur more than once per clock period ($T_{MAX}$) of Max_CLK. Thus, the clocked standby mode controls may generate CSM_CLK using Base_CLK to ensure that $V_{OUT}$ is being generated by the voltage generation circuit 112 just prior to each access is taking place and when $V_{OUT}$ is about to be used by other circuits on the memory device 100. Accordingly, as depicted, at time T2, and again at time T3, the rising edge of Base_CLK may cause CSM_CLK to be lowered to a low logic level for a time equal to $T_{PW}$.

Even if the period $T_{BASE}$ of Base_CLK shrinks due to a change in operating conditions of the memory device 100 (e.g., a change in temperature or increased usage of the memory device 100), the clocked standby mode controls 514 may continue to generate CSM_CLK from Base_CLK. Accordingly, at time T4 the operating characteristics of the memory device 100 may change, causing $T_{BASE}$ to shrink. Because the CSM_CLK signal is generated using the Base_CLK signal, the period of the CSM_CLK signal may similarly shrink. Thus, as depicted at times T4 and T5, rising edges of Base_CLK may cause a low pulse of length $T_{PW}$ to be generated for CSM_CLK by the clocked standby mode controls 514. Generating CSM_CLK using Base_CLK (where $T_{BASE}$ is less than $T_{MAX}$) ensures the voltage generation circuit 112 is enabled and that $V_{OUT}$ is being generated just prior to each access to the memory device 100 taking place.

According to one embodiment of the invention, Max_CLK and Base_CLK may be synchronous signals. Where the Max_CLK signal and Base_CLK signals are synchronous, the signal with the longer period may have a rising edge which corresponds in time with a rising edge of the signal with the shorter period. Synchronization between signals is depicted in FIG. 6 at times T2 and T3 and in FIG. 7 at times T2, T3, T4, and T5. In one embodiment, where the clock signals are synchronous, the clock signals may be an integer multiple of each other (i.e., the period $T_{MAX}$ may be an integer multiple of $T_{BASE}$ or vice versa) such as 1, 2, 3, 4, etc. Where $T_{MAX}$ is equal to $T_{BASE}$, (i.e., each clock edge is perfectly synchronous), CSM_CLK may be generated with either Max_CLK or Base_CLK with the same effect. In another embodiment, the period of each of the clock signals may be a binary multiple of each other such as 1, 2, 4, 8, etc. In yet another embodiment of the invention, the clock signals may not be synchronous and the clock signals may not have periods ($T_{BASE}$, $T_{MAX}$) which are exact multiples of each other.

Referring back to FIG. 1, in one embodiment of the invention, a clocked standby mode may be used with other circuitry on the memory device 100 such as control circuitry 102, memory arrays 104, or any other circuitry on the memory device 100. In one embodiment, a single set of clocked standby mode controls 514 may be used for the entire memory device 100. In another embodiment, multiple sets of clocked standby mode controls 514 may be used for different circuits in the memory device 100. For instance, where the memory device has multiple voltage generation circuits 112, a separate clocked standby mode control 514 may be used for each voltage generation circuit 112. In another embodiment, different control signals (CSM_EN, Base_CLK, and Max_CLK) may be used for each clocked standby mode control 514 such that a specially tailored CSM_CLK signal may be utilized for each voltage generation circuit 112 according to the memory device's usage of each output voltage $V_1$, $V_2$, ... $V_X$.

Clocked Standby Mode Enabled/Disabled by a Temperature Sensor

As previously described, the magnitude of voltage drop $V_{DROOP}$ in $V_{OUT}$ may vary with the temperature of the memory device 100. For instance, the memory device 100 may include a temperature sensor (e.g. the temperature sensor 108 depicted in FIG. 1) which may be used to adjust the refresh period of the memory device 100 according to the temperature of the memory device 100. Where the refresh rate of the memory device 100 is decreased due to a temperature measurement, the period $T_{BASE}$ of the base clock signal Base_CLK may be increased, lowering the refresh rate. Where the period $T_{BASE}$ of Base_CLK is increased, the period of CSM_CLK may increase, causing the magnitude of $V_{DROOP}$ to increase correspondingly, as described above.

Figure 8:
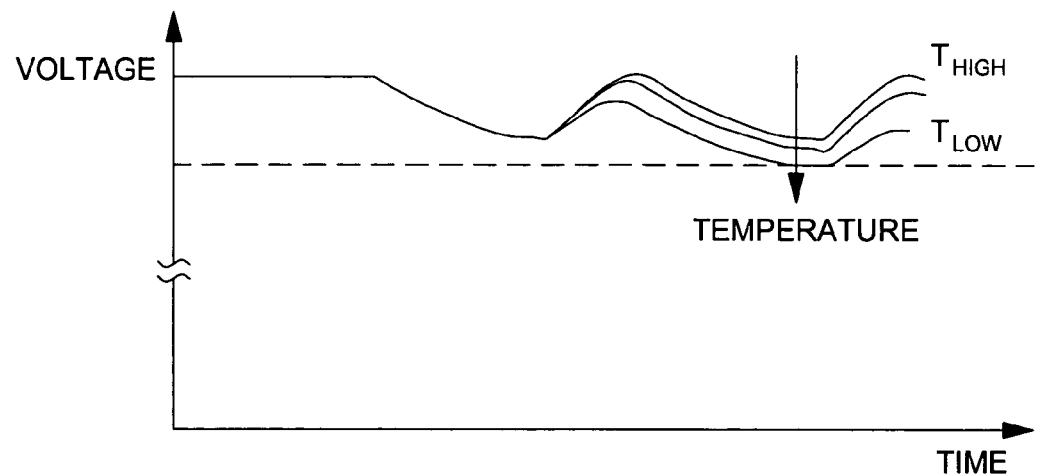
FIG. 8 is a graph depicting the voltage drop of an output voltage with respect to temperature.

FIG. 8 is a graph depicting the voltage drop $V_{DROOP}$ of an output voltage $V_{OUT}$ with respect to temperature. As depicted, the magnitude of $V_{DROOP}$ may be small at high temperatures (e.g., $T_{HIGH}$). However, at lower temperatures (e.g., $T_{LOW}$), the magnitude of $V_{DROOP}$ may increase such that the voltage drop falls below an acceptable threshold (depicted as the dotted line in FIG. 8). The magnitude of $V_{DROOP}$ may increase at certain temperatures for several reasons. In one case, the leakage currents which cause $V_{DROOP}$ may increase at certain temperatures. In another case, the temperature of the memory device 100 may cause the period $T_{BASE}$ of Base_CLK to either become too large or too small such that the clocked standby mode controls do not maintain the CSM_CLK signal at an appropriate frequency.

Accordingly, for some temperature ranges, $V_{DROOP}$ and $T_{BASE}$ may be acceptable, and for other temperature ranges, $V_{DROOP}$ and $T_{BASE}$ may be unacceptable. In one embodiment, the temperature range for which $V_{DROOP}$ or $T_{BASE}$ is unacceptable may be a range which includes every temperature under a certain temperature. In other embodiments, the temperature range may include every temperature over a certain temperature, every temperature between two given temperatures, or every temperature which is not between two given temperatures.

In any case, each threshold temperature range for which $V_{DROOP}$ and/or $T_{BASE}$ are unacceptable may be determined during a design, manufacturing, or testing phase of the memory device 100. For example, after the memory device 100 has been fabricated, a series of tests may be performed on the memory device 100. During the tests, the temperature of the memory device 100 may be measured. If, during testing, it is found that the clocked standby mode causes the memory device 100 to fail at certain temperatures (e.g., due to unacceptable voltages drops or Base_CLK periods), those temperatures for which the memory device 100 fails may be identified as part of the unacceptable temperature range for the clocked standby mode of the memory device 100. According to one embodiment of the invention, the unacceptable temperature range may be the same for each device being produced by a particular process/batch, or for each device on a given wafer. According to another embodiment of the invention, the unacceptable temperature range may be different for each memory device 100 and may be chosen by testing each device individually, either while the device is on a wafer or after the device has been separated from the wafer and packaged. In another embodiment, the temperature range may be determined before the device is manufactured using design and simulation software.

Where the threshold temperature range is determined during a design phase of the memory device 100, the temperature range may be stored on the device during the design phase, for instance, by storing the temperature range in a read-only memory (ROM) of the memory device. Where the temperature range is determined during a manufacturing or testing phase of the memory device, the temperature range may be stored on the device by programming one or more fuses on the memory device. In one embodiment, the fuses may be laser-cut fuses. In another embodiment, the fuses may be electronically programmable fuses (e-fuses). Other methods of determining and storing a temperature range, for instance, determining the temperature range during an initialization phase of the memory device 100 and storing the range in one or more registers, should be readily apparent to those skilled in the art.

In one embodiment of the invention, a control signal from a temperature sensor may be used to prevent the clocked standby mode from operating in a temperature range which may cause memory device 100 failures. Thus, according to one embodiment, the temperature of the memory device 100 may be measured. The temperature of the memory device 100 may be measured using the temperature sensor 108 depicted in FIG. 1. If the measured temperature is outside a threshold temperature range, the memory device 100 may be placed in the clocked standby mode, whereby the voltage generation circuit 112 is selectively enabled with the clock signal Base_CLK. If the measured temperature is within a threshold temperature range, the memory device 100 may be prevented from being placed in the clocked standby mode. By disabling the clocked standby mode for temperatures within the threshold temperature range, the memory device 100 is prevented from malfunctioning.

Figure 9:
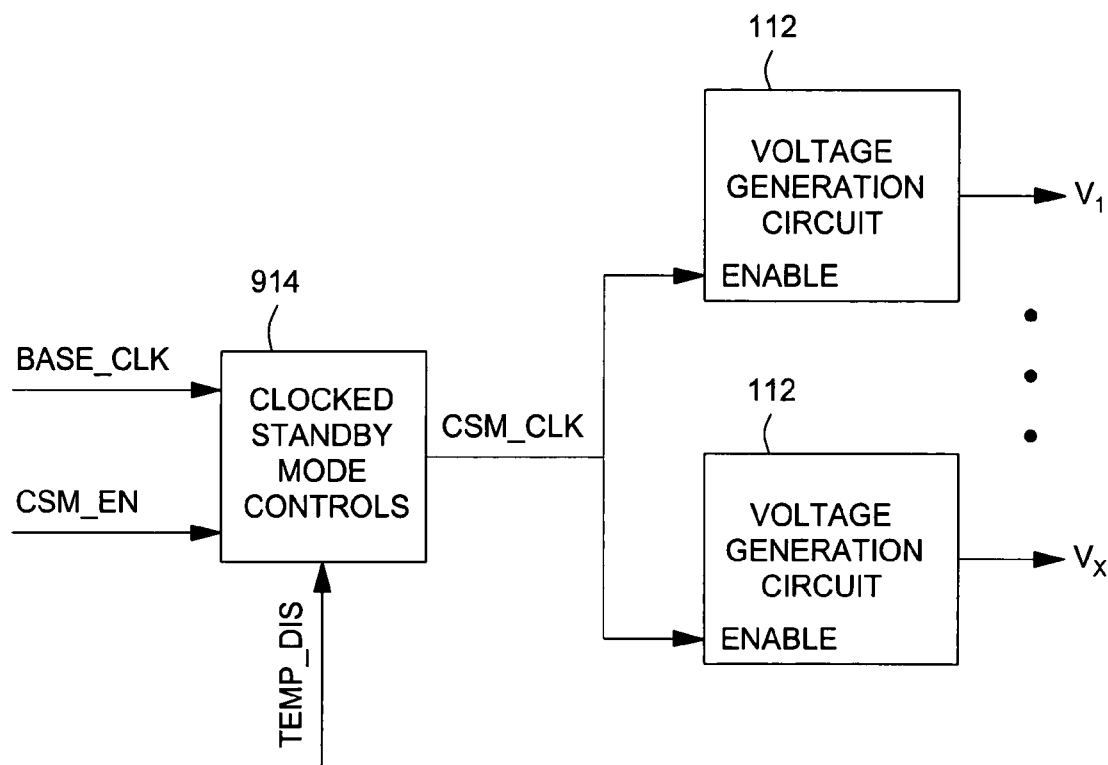
FIG. 9 depicts clocked standby mode controls which generates a clocked standby mode control signal using a temperature signal for disabling the clocked standby mode according to one embodiment of the invention.

FIG. 9 depicts clocked standby mode controls 914 which generates a clocked standby mode control signal (CSM_CLK) using a clocked standby mode enable signal (CSM_EN), a base clock signal (Base_CLK), and a temperature signal for disabling the clocked standby mode, referred to as Temp_DIS. According to one embodiment of the invention, the Temp_DIS signal may be generated by the control circuits 102 of the memory device 100. For example, the control circuits 102 may use the temperature sensor 108 to measure the temperature of the memory device 100. If the temperature of the memory device is within an acceptable range (such that the magnitude of $V_{DROOP}$ is not unacceptably large or such that $T_{BASE}$ is within an appropriate range), the control circuits 102 may set Temp_DIS to a certain logic level (e.g., a low logic level), thus enabling the clocked standby mode and causing CSM_CLK to be generated by the clocked standby mode controls 914 using Base_CLK as described above. If the temperature of the memory device is not within an acceptable range (such that the magnitude of $V_{DROOP}$ is unacceptably large or $T_{BASE}$ is not within an appropriate range), the control circuits 102 may set Temp_DIS to a certain logic level (e.g., a high logic level), thus disabling the clocked standby mode and causing CSM_CLK to be set to a logic level (e.g., a low logic level) which may continuously enable the voltage generation circuit 112 and thereby prevent the memory device 100 from malfunctioning.

Figure 10:
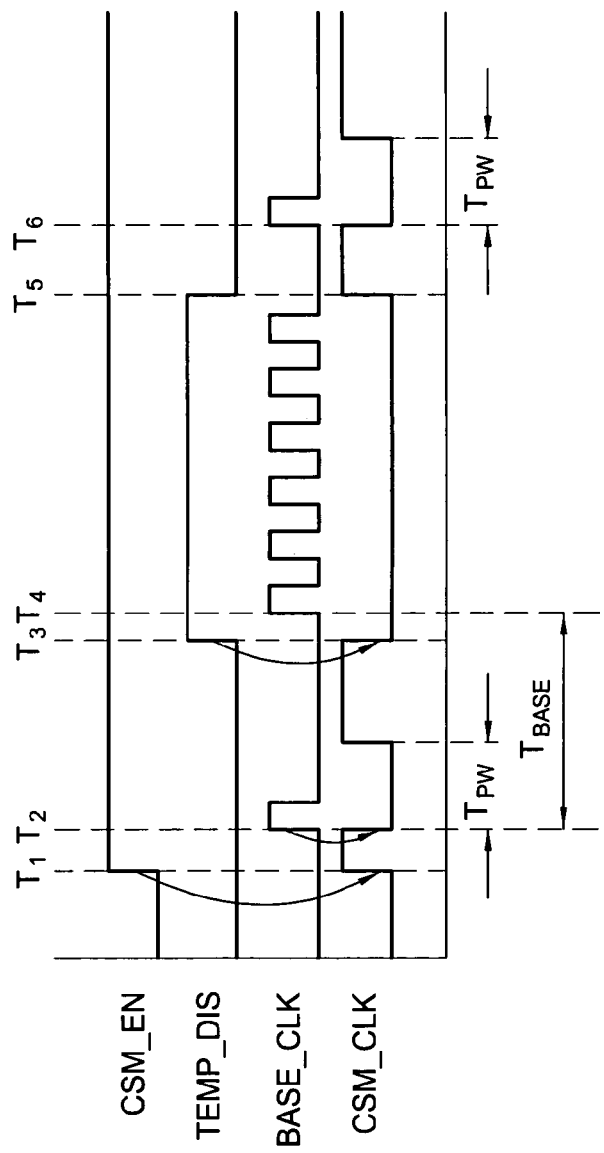
FIG. 10 is a timing diagram which depicts a clocked standby mode control signal which selectively enables and disables a voltage generation circuit using a temperature signal according to one embodiment of the invention.

FIG. 10 is a timing diagram which depicts a clocked standby mode control signal (CSM_CLK) which selectively enables and disables a voltage generation circuit 112 using a temperature signal according to one embodiment of the invention. The clocked standby mode may be enabled at time T1 when CSM_EN is raised to a high logic level. When CSM_EN is raised to a high logic level, the clocked standby mode controls 914 may determine if the Temp_DIS signal indicates that the operating temperature of the memory device is within an appropriate operating threshold for the clocked standby mode. If the Temp_DIS signal does indicate that the device is operating at an appropriate temperature (e.g., if the Temp_DIS signal is at a low logic level), the clocked standby mode controls may cause CSM_CLK to be raised to a high logic level, disabling the voltage generation circuit 112. While the Temp_DIS signal continues to remain at a low logic level indicating that the memory device 100 is operating at an appropriate temperature for the clocked standby mode, the clocked standby mode controls 914 may generate the CSM_CLK signal using the Base_CLK signal. Accordingly, at time T2, the clocked standby mode controls may detect a rising edge of the Base_CLK signal and generate a low logic level pulse of width $T_{PW}$ for the CSM_CLK signal. When the CSM_CLK signal is a low logic level, the voltage generation circuit 112 may be enabled and may consume power while generating the output voltage $V_{OUT}$.

At some time later T3, the operating temperature of the memory device may enter a temperature range which causes an unacceptable voltage drop $V_{DROOP}$ or an unacceptable base clock period $T_{BASE}$. The temperature of the memory device 100 may be detected by the temperature sensor 108 in the control circuits 102, and the control circuits 102 may then determine that the temperature is outside of an acceptable range for operation of the clocked standby mode. Accordingly, at time T3 the control circuits 102 may raise the Temp_DIS signal to a high logic level, indicating that the clocked standby mode should be disabled. When the Temp_DIS signal is asserted, the clocked standby mode controls 914 may cause CSM_CLK to be lowered to a low logic level, disabling the clocked standby mode and continuously enabling the voltage generation circuit. While Temp_DIS is asserted, the base clock signal Base_CLK may not have any effect on CSM_CLK. Accordingly, at time T4, a rising edge on the Base_CLK signal may have no effect on the CSM_CLK signal. By disabling the clocked standby mode for the measured temperature which is within the range of unacceptable temperatures for the memory device 100, the memory device is prevented from malfunctioning.

After the temperature of the memory device 100 has entered an unacceptable range, the temperature may later change again and enter an acceptable temperature range. Accordingly, at time T5, the control circuits 102 may detect a change in the temperature of the memory device 100 wherein the temperature is within an acceptable temperature range such that the memory device 100 may operate in the clocked standby mode without malfunctioning. Accordingly, at time T5, the control circuits 102 may lower the Temp_DIS signal, indicating that the clocked standby mode may once again be enabled. When the clocked standby mode controls detect that the Temp_DIS signal has been lowered, the CSM_CLK signal may be raised to a high logic level, causing the voltage generation circuit 112 to be disabled and conserving power. While the Temp_DIS signal remains at a low logic level and the CSM_EN signal remains at a high logic level, the clocked standby mode controls 914 may detect each rising edge of Base_CLK (e.g., at time T6) and generate a corresponding low logic level pulse of duration $T_{PW}$ for the CSM_CLK signal. While the memory device 100 is operating, the control circuits 102 may continue to monitor the temperature of the memory device 100 and raise or lower Temp_DIS accordingly. Thus, the Temp_DIS signal may be used to ensure that the magnitude of $V_{DROOP}$ does not become unacceptably large and that $T_{BASE}$ does not become unacceptably long or short.

Figure 11:
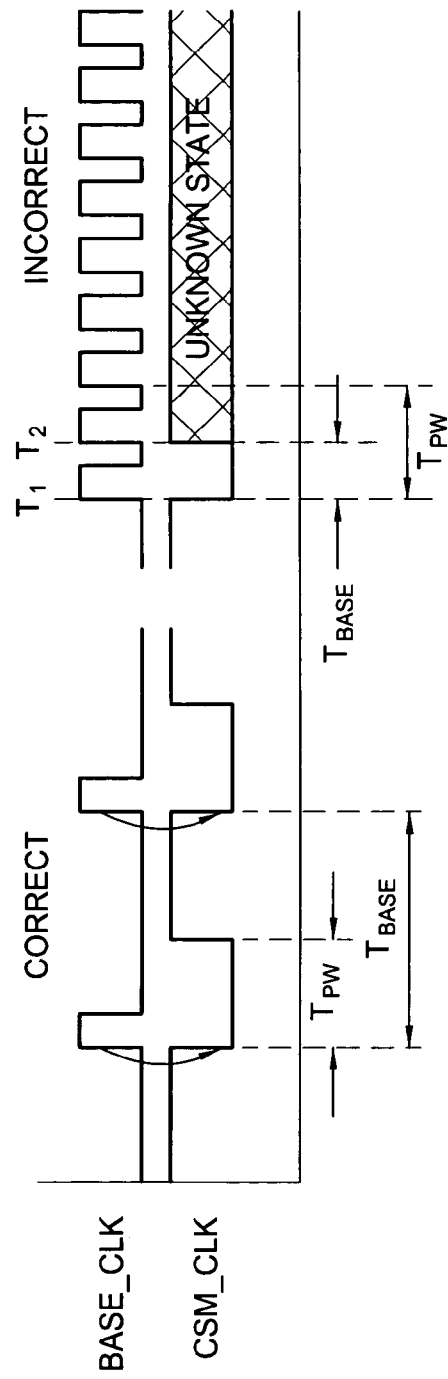
FIG. 11 is a timing diagram which depicts a base clock signal which varies with temperature and causes clocked standby mode controls to enter an unknown state.

In some cases, disabling the clocked standby mode based on the temperature of the memory device 100 may also ensure that the period $T_{BASE}$ Of the base clock signal Base_CLK does not become so small as to cause the clocked signal mode controls 914 to enter an unknown state. FIG. 11 is a timing diagram which depicts a base clock signal Base_CLK which varies with temperature and causes the clocked standby mode controls 914 to enter an unknown state in some cases.

As described above, for some temperature ranges, the clocked standby mode controls 914 may use the Base_CLK signal to successfully generate the CSM_CLK signal which is used to selectively enable and disable the voltage generation circuit 112 (as depicted under the heading "Correct"). However, in other cases, the temperature of the memory device 100 may enter a temperature range such that the frequency of the base clock signal Base_CLK causes the clocked standby mode controls 914 to enter an unknown state and generate a CSM_CLK with an unknown or unpredictable value (depicted in FIG. 11 under the heading "Incorrect"). The clocked standby mode controls 914 may generate an unknown or unpredictable value of CSM_CLK, for instance, where the period $T_{BASE}$ of the base clock signal is less than or equal to the size of the pulse width $T_{PW}$ generated for CSM_CLK by the clocked standby mode controls 914. This may occur because of synchronization problems within the circuitry in the clocked standby mode controls 914 which is used to generate the CSM_CLK signal. Thus, at time T1, a rising edge of Base_CLK may cause a low logic value pulse of duration $T_{PW}$ to be generated for CSM_CLK. At some time later T2, before the end of the pulse, another rising edge for the Base_CLK signal may occur, causing the CSM_CLK signal to be placed in an unknown state by the clocked standby mode controls 914. According to one embodiment of the invention, the unknown state depicted in FIG. 11 may be prevented by disabling the clocked standby mode controls for temperature ranges of the memory device 100 which cause the period $T_{BASE}$ of the Base_CLK to fall below the duration of the pulse width $T_{PW}$. In other words, the temperature range for which the clocked standby mode is disabled may be chosen such that the temperature range includes temperatures at which the clock frequency is above a critical frequency.

Referring back to FIG. 1, in one embodiment of the invention, a clocked standby mode may be used with other circuitry on the memory device 100 such as control circuitry 102, memory arrays 104, or any other circuitry on the memory device 100. In one embodiment, a single set of clocked standby mode controls 914 may be used for the entire memory device 100. In another embodiment, multiple sets of clocked standby mode controls 914 may be used for different circuits in the memory device 100. For instance, where the memory device has multiple voltage generation circuits 112, a separate clocked standby mode control 914 may be used for each voltage generation circuit 112. In another embodiment, different control signals (CSM_EN, Base_CLK, and Temp_DIS) may be used for each clocked standby mode control 914 such that a specially tailored CSM_CLK signal may be utilized for each voltage generation circuit 112 according to the memory device's usage of each output voltage $V_1$, $V_2$, . . . $V_X$ and according to the viable temperature ranges for each output voltage $V_1$, $V_2$, . . . $V_X$.

While the foregoing is directed to embodiments of the present invention, other and further embodiments of the invention may be devised without departing from the basic scope thereof, and the scope thereof is determined by the claims that follow.

What is claimed is:

1. A method for controlling a voltage generator for a memory device, the method comprising:
   measuring a temperature of the memory device;
   if the measured temperature is outside a threshold temperature range, allowing the memory device to be placed in a clocked standby mode (CSM), whereby the voltage generator is selectively enabled with a clock signal; and
   if the measured temperature is within a threshold temperature range, preventing the memory device from being placed in the clocked standby mode (CSM).

2. The method of claim 1, wherein the threshold range is any temperature above a threshold temperature.

3. The method of claim 1, wherein the period of the clock signal is chosen such that the voltage output by the generator does not fall below a threshold voltage within the period.

4. The method of claim 1, wherein the temperature range is chosen such that the temperature range includes temperatures at which the clock frequency is above a critical frequency.

5. A memory device comprising:
a voltage generation circuit configured to maintain a voltage;
a control circuit configured to selectively enabled the voltage generation circuit by:
measuring a temperature of the memory device;
if the measured temperature is outside a threshold temperature range, placing the memory device in a clocked standby mode (CSM), whereby the voltage generator is selectively enabled with a clock signal; and
if the measured temperature is within a threshold temperature range, preventing the memory device from being placed in the clocked standby mode (CSM).

6. The memory device of claim 5, wherein the threshold range is any temperature above a threshold temperature.

7. The memory device of claim 5, wherein the period of the clock signal is chosen such that the voltage output by the voltage generation circuit does not fall below a threshold voltage within the period.

8. The memory device of claim 5, wherein the temperature range is chosen such that the temperature range includes temperatures at which the clock frequency is above a critical frequency.

9. A method for controlling a voltage generator for a memory device, the method comprising:
disabling a clocked standby mode (CSM), whereby the voltage generator is selectively enabled in conjunction with a clock signal, if a measured temperature of the memory device is within a threshold temperature range.

10. The method of claim 9, wherein disabling the clocked standby mode comprises setting the clock signal to a low logic level while the measured temperature of the memory device is within the threshold temperature range.

11. The method of claim 9, wherein the threshold temperature range is any temperature above a threshold temperature.

12. The method of claim 9, wherein a period of the clock signal is chosen such that the voltage output by the generator does not fall below a threshold voltage within the period.

13. The method of claim 9, wherein the threshold temperature range is chosen such that the temperature range includes temperatures at which a clock frequency of the clock signal is above a critical frequency.

14. An integrated circuit, comprising:
a temperature sensor;
a voltage generation circuit; and
control circuitry configured to:
measure a temperature of the integrated circuit with the temperature sensor;
disable a clocked standby mode (CSM), whereby the voltage generation circuit is selectively enabled in conjunction with a clock signal, if a the measured temperature of the integrated circuit is within a threshold temperature range.

15. The integrated circuit of claim 14, wherein disabling the clocked standby mode comprises setting the clock signal to a low logic level while the measured temperature of the memory device is within the threshold temperature range.

16. The integrated circuit of claim 14, wherein the threshold temperature range is any temperature above a threshold temperature.

17. The integrated circuit of claim 14, wherein a period of the clock signal is chosen such that the voltage output by the voltage generation circuit does not fall below a threshold voltage within the period.

18. The integrated circuit of claim 14, wherein the threshold temperature range is chosen such that the temperature range includes temperatures at which a clock frequency of the clock signal is above a critical frequency.

19. A memory device comprising:
a means for generating a voltage; and
a means for selectively enabling the means for generating by:
measuring a temperature of the memory device;
if the measured temperature is outside a threshold temperature range, placing the memory device in a clocked standby mode (CSM), whereby the means for generating is selectively enabled with a clock signal; and
if the measured temperature is within a threshold temperature range, preventing the memory device from being placed in the clocked standby mode (CSM).

20. The memory device of claim 19, wherein the temperature range is chosen such that the temperature range includes temperatures at which the clock frequency is above a critical frequency.

* * * * *